United States Patent [19]

Jindrick et al.

[11] Patent Number: 4,466,074

[45] Date of Patent: Aug. 14, 1984

[54] POWER OUTAGE TIMER

[75] Inventors: James A. Jindrick, Racine; James R. Hurley, Brookfield; Clyde Gilker, S. Milwaukee, all of Wis.

[73] Assignee: McGraw-Edison Company, Rolling Meadows, Ill.

[21] Appl. No.: 303,599

[22] Filed: Sep. 18, 1981

[51] Int. Cl.³ .............................. G04F 10/00
[52] U.S. Cl. .................. 364/569; 307/200 A; 364/145; 364/184; 364/483; 364/707
[58] Field of Search .......... 364/483, 492, 493, 569, 364/707, 145, 184; 346/14 MR; 340/825.26; 368/121, 113; 307/200 A, 200 B, 597, 603

[56] References Cited

U.S. PATENT DOCUMENTS

| | | | |
|---|---|---|---|
| 2,269,603 | 1/1942 | Rockwood | 368/121 |
| 2,454,191 | 11/1948 | MacDonald | 368/121 |
| 3,790,890 | 2/1974 | Doittau | 324/189 |
| 3,887,850 | 6/1975 | Sterff | 317/141 |
| 4,011,927 | 3/1977 | Smith | 184/26 |
| 4,099,068 | 7/1978 | Kobayashi | 307/200 |
| 4,260,907 | 4/1981 | Winebarger | 307/200 A |
| 4,293,915 | 10/1981 | Carpenter | 364/145 |

Primary Examiner—Errol A. Krass
Assistant Examiner—Clifford L. Tager
Attorney, Agent, or Firm—James A. Gabala; Jon Carl Gealow; Tom Vigil

[57] ABSTRACT

The power outage timer (36, 136, or 236) forms a part of an electronic watt-hour meter (10) having a microprocessor (22), a real time value memory and a real time clock signal input from a voltage supply (23). The power outage timer (36, 136, or 236) is coupled to the microprocessor (22) for generating a signal when, after a power outage, power is restored, such signal being indicative of the time duration of the power outage and being input to the microprocessor (22) so that the microprocessor (22) can update the real time value in an EAROM (32) to reflect the correct real time.

7 Claims, 4 Drawing Figures

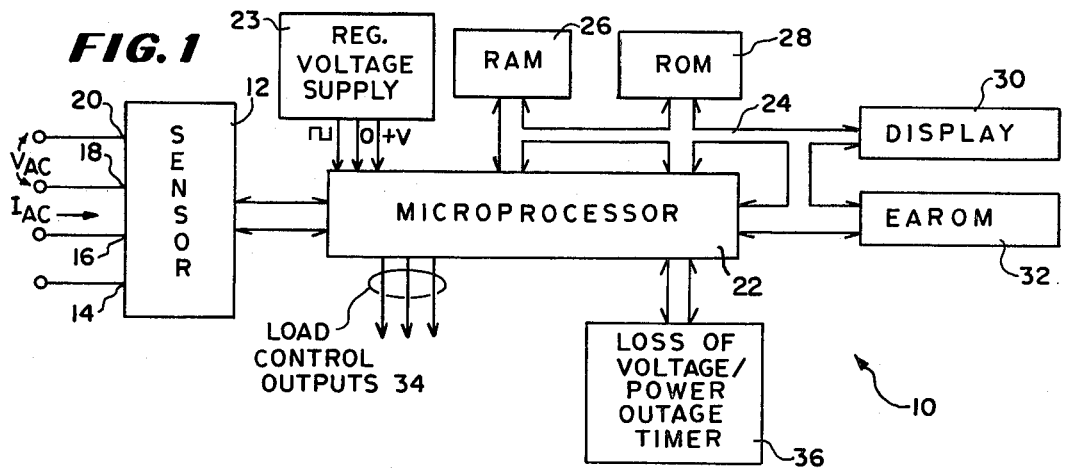

POWER OUTAGE TIMER

FIELD OF THE INVENTION

The present invention relates to a power outage or loss of voltage timer that is particularly useful in a "smart" solid state watt-hour meter for telling the microprocessor of the length of time there was a power outage.

BACKGROUND OF THE INVENTION

Heretofore there have been proposed "smart" electronic watt-hour meters which include a microprocessor, a real time clock signal source and nonvolatile memories for storing real time values. Such a meter can then be used for load control to economically use electric power. In this respect, loads such as refrigerators and water heaters can be turned off during high demand periods when the cost of KWH's is high, e.g., daytime, and turned on during low demand periods when the cost of KWH's is low, e.g., nighttime.

Some examples of such watt-hour meter are disclosed in the following U.S. patents:

| U.S. Pat. No.: | Patentee: |
|---|---|
| 4,075,699 | Schneider et al. |
| 4,240,030 | Bateman et al. |
| 4,241,237 | Paraskevabos et al. |
| 4,253,151 | Bouve |

All of the meters disclosed in these patents utilize some form of real time clock and/or calendar so that the meter is "smart" to know when to connect or disconnect certain customer/consumer loads.

Of course, if there is a power outage—loss of voltage, the real time clock must be somehow updated or an alarm must be raised. The latter is done in the meter disclosed in the Schneider et al. U.S. Pat. No. 4,075,699, which includes a power-failed sensing circuit.

Also heretofore, various capacitor timing circuits for various uses have been proposed. Examples of some of these prior art timing circuits are disclosed in the following U.S. patents.

| U.S. Pat. No.: | Patentee: |
|---|---|
| 3,790,890 | Doitlau et al. |
| 4,011,927 | Smith |

Also, a power supply interruption detection circuit is disclosed in U.S. Pat. No. 4,099,068.

As will be described in greater detail hereinafter, the power outage (loss of voltage) timer of the present invention differs from previously proposed timing circuits by providing a timer which produces a timing signal, when, after a power outage, the power is restored and a capacitor in the timer is charged back up to its normal voltage. Such timing signal can be used by a microprocessor for updating and correcting the real time value stored in a non-volatile memory.

SUMMARY OF THE INVENTION

According to the invention, there is provided in an electronic watt-hour meter having a microprocessor, a real time value memory and a real time clock signal input. An improvement comprising a power outage/loss of voltage timing means coupled to the microprocessor for generating a signal when, after a power outage, power is restored, such signal being indicative of the time duration of the power outage and being input to the microprocessor so that the microprocessor can update the real time value in the memory to reflect the correct real time.

BRIEF DESCRIPTION OF THE DRAWINGS

FIG. 1 is a block diagram of a "smart" solid state watt-hour meter including the power outage/loss of voltage timer of the present invention.

FIG. 2 is a schematic circuit diagram of one embodiment of the timer shown in FIG. 1.

FIG. 3 is a schematic circuit diagram of another embodiment of the timer shown in FIG. 1.

FIG. 4 is a schematic circuit diagram of still another embodiment of the timer shown in FIG. 1.

DESCRIPTION OF THE PREFERRED EMBODIMENTS

Referring now to FIG. 1, there is illustrated therein a "smart" solid state watt-hour meter 10 including a watt-hour sensor 12 having current inputs 14 and 16 and voltage inputs 18 and 20.

The watt-hour sensor 12 is coupled to a microprocessor 22 which is powered by a power supply 23. The power supply 23 is a regulated AC to DC power supply powered by the AC line voltage which is also input to the watt-hour sensor 12. The power supply 23 also supplies a 60 Hz square wave clock signal to the microprocessor 22.

As shown, the microprocessor is coupled by an information bus 24 to a RAM 26, a ROM 28, a visual display 30 and an electrically alterable ROM (EAROM) 32.

The microprocessor 22 has load control outputs 34 and, in accordance with the teachings of the present invention, a loss of voltage/power outage timer 36 which is coupled to the microprocessor 22 for updating a real time value stored in the EAROM 32 when power is restored after a power outage to enable the microprocessor 22 to continue a load control function.

The watt-hour meter 10 briefly described above can be of the type disclosed in copending application Ser. No. 303,627, filed on Sept. 18, 1981 entitled: Solid State Watthour Meter, the disclosure of which is incorporated herein by reference. A more detailed description of the construction and operation of the watt-hour meter 10 is set forth in the aforesaid copending application.

The load control outputs 34 are coupled to circuit breakers (not shown) for various consumer/customer loads such as water heaters, refrigerators, air conditioners, etc.

The load control function of the microprocessor 22 is to determine the real time (time of day) as determined from the initial setting of the real time value in the EAROM 32 as updated by the 60 Hz clock signal. Then, during high electric power demand periods, e.g., daytime, when the cost of kilowatt hours is high, the microprocessor 22 shuts off the load, e.g., water heater.

Later, during low electric power demand periods, e.g., nighttime, when the cost of kilowatt hours is low, the microprocessor 22 turns on the water heater load.

If there is a power outage/loss of voltage, the timer 36 will cause discharge of a timing capacitor 40 (FIG. 2) through a shunt resistor 42 connected across the capacitor 40. Then, when the power/voltage is restored, the capacitor 40 will recharge to its previous normal value and when it reaches its normal value, a timing signal is sent to the microprocessor 22. The elapsed time between a first point in time when the restoration of the power/voltage occurs and a second point in time when the timing signal occurs is related to and indicative of the time period of the power outage, provided, of course, that the capacitor 40 had not discharged to zero. Preferably, the RC time constant is such that the timer 36 will time a power outage for up to six hours.

Of course, the microprocessor 22 will determine if the time period sensed is equal to the maximum time period for charging the capacitor 40 and if so, will abort the load control function and raise an alarm flag indicating that real time value stored in the EAROM 32 needs to be updated and corrected.

For short power outages, e.g., less than six hours, the microprocessor will convert the time period to a real time value and add it to the real time value in the EAROM 24 memory so the load control function can be continued on real time.

Referring now to FIG. 2, the timer circuit 36 has a reference voltage input conductor or bus 44 which supplies reference voltage through a diode 46 and a charging resistor 48 to the capacitor 40.

A junction 50 between resistor 48 and capacitor 40 is coupled to one input 52 of a comparator 54.

Another input 56 is coupled to a junction 58 in a voltage divider 60 comprising a series connected diode 62, first resistor 64 and second resistor 66 connected between the voltage bus 44 and a system common or ground 68. An output 70 from the comparator 54 is coupled to the microprocessor 22.

After a power outage when voltage returns to the bus 44, the capacitor 40 starts to charge via the diode 46 and resistor 48. When the voltage on the capacitor 40 just exceeds the voltage at junction 58 on the voltage divider 60, the comparator output 70 changes state. The time period from power up to state change is proportional to the time of the outage and is utilized by the microprocessor 22 to update and correct the real time value.

It will be appreciated that the resistor 64 and 66 values are chosen so that the normal voltage at junction 58 is at or just below the normal voltage on the capacitor 40.

In FIG. 3 is illustrated another embodiment of the power outage timer of the present invention which timer is generally identified by reference number 136. In this timer 136 there is provided a first charging capacitor 140 having a shunt resistor 142 thereacross. A conductor/voltage bus 144 from the microprocessor 22 supplies a reference voltage through a diode 146 for charging capacitor 140.

The voltage on capacitor 140 at a junction 150 is supplied to one input 152 of a comparator 154.

Another, second capacitor 156 is series connected with a resistor 158 between another conductor/voltage bus 160 and a system common or ground 162.

A junction 164 between resistor 158 and capacitor 156 is connected to another input 166 of comparator 154 and an output 170 of the comparator 154 is connected to the microprocessor 22.

A shunting transistor 172 is connected across the capacitor 156, the base 173 of which is connected to the voltage bus 160 with a base bias resistor 174 connected between the base 173 and ground 162 such that when the power is on transistor 172 is off and capacitor 156 is charged to its normal voltage. The capacitor 140 is also charged to its normal voltage When there is a power outage, capacitor 140 starts to decay on its RC characteristic and capacitor 156 is shorted out as a result of transistor 172 being turned on. At the same time, a switch 178 in the microprocessor 22 coupling the supply voltage to the bus 144 is opened.

Now when the voltage returns, the capacitor 140 remains unconnected to the source of power (and continues to decay on its RC characteristic). Meanwhile, capacitor 156 is charged via its associated resistor 158, the transistor 172 being again turned off.

The time it takes the voltage on capacitor 156 to just exceed the voltage on capacitor 140 is proportional to the time of the outage and when this occurs, a timing signal is sent from output 170 of comparator 154 to the microprocessor. This time signal is used by the microprocessor 22 to calculate the time period of the outage and then correct the real time value. Also, the timing signal causes reclosing of switch 178.

A still further embodiment of the timer of the present invention is illustrated in FIG. 4 and is generally identified therein by reference number 236 and is a digital timer 236. The timer 236 includes a timing capacitor 240 having a shunt resistor 242 connected across same. The capacitor 240 is charged to a desired voltage level from a voltage bus 244 through a digital transmission gate 245 and a charging resistor 246. Another digital transmission gate 247 is connected between resistor 246 and a system common or ground 248.

A junction 250 between resistor 246 and capacitor 240 is connected to an input 252 of a comparator 254. A junction 258 in voltage divider 260, between two resistors 262 and 264 thereof, is connected to another input 266 of the comparator 254. The voltage divider 260 is connected as shown between the bus 244 and ground 248.

An output 270 of comparator 254 is connected to microprocessor 22. Transmission gate 245 is controlled by a control line 275 from microprocessor 22 and transmission gate 247 is controlled by a control line 277 from the microprocessor 22.

While power is being supplied, the voltage on capacitor 240 will go up and down. In this respect gate 245 is opened to charge capacitor 240 to a voltage above the voltage at junction 258 at which time an output signal from comparator 254 tells the microprocessor 22 to close gate 245 and open gate 247 to discharge the voltage on capacitor 240 which then falls below the voltage at junction 258 at which time a signal from comparator 254 repeats the process.

When power/voltage is lost the gates 245 and 247 are closed and capacitor 240 decays through resistor 242.

When voltage returns, the voltage on the capacitor 240 is compared to the voltage at 258 in the voltage divider 260 by the comparator 254. If the capacitor voltage exceeds the divider voltage the lower gate 247 is pulsed by the microprocessor 22 draining some charge off the capacitor 240 and lowering its voltage. Another comparison is made. This cycle is continued until the capacitor voltage is just less than the voltage at junction 258 at which time the comparator 254 output voltage changes. The microprocessor 22 counts the number of pulses needed to flip the comparator 254. The count of number of pulses is proportional to the time of the power outage. If the capacitor 240 voltage is less than the divider voltage at junction 258, the microprocessor 22 must pulse the raise gate 245.

In all three embodiments the decay time of capacitor 40, 140 or 240 is very long compared to the test time to determine its charge.

From the foregoing description, it is apparent that the timers 36, 136 and 236 are totally solid state and will provide a reliability comparable with a thirty year design life. Although the timers 36, 136 and 236 do not have high accuracy, they are suitable for resolving a 15 minute period in power outages up to 6 hours. Also, the meter reading event can be utilized to reset the meter time of day clock to the exact time during the monthly meter reading.

The timers 36, 136 and 236 have a number of advantages, some of which have been described above and others of which are inherent in the invention. Also, many modifications can be made to the timers 36, 136 and 236 of the invention without departing from the teachings of the invention. Accordingly, the invention is only to be limited as necessitated by the accompanying claims.

We claim:

1. In an electronic watt-hour meter operated by a microprocessor and having connected thereto a real time value electrically alterable read only memory and a real time clock signal input, the improvement comprising:

a power outage/loss of voltage timing means, coupled to the microprocessor, for generating a signal after power is restored to said microprocessor following a power outage, such signal being indicative of the time duration of the power outage when the watt-hour meter was inoperative and being input to the microprocessor so that the microprocessor updates the real time value in the electrically alterable read only memory to reflect the correct real time in the memory.

2. In the electronic watt-hour meter according to claim 1, wherein said timing means comprises a resistor and capacitor network coupled to a voltage comparator.

3. In the electronic watt-hour meter according to claim 2, wherein said resistor and capacitor network includes:

a voltage supply derived from the voltage supplied to said watt-hour meter, said voltage supply providing a first and a second reference voltage, a capacitor which is charged by said first reference voltage, a shunt resistor which is connected across said capacitor, and wherein said voltage comparator has a first input connected to said capacitor, a second input connected to said second reference voltage, and an output connected to the input of said microprocessor, said second reference voltage normally being at or just below the normal voltage on said capacitor and wherein said microprocessor:

(a) senses a first point in time when power is restored after a power outage;

(b) senses a second point in time when the output of said comparator changes indicating said capacitor has recharged, after having discharged through said shunt resistor during a power outage, back to its normal value;

(c) calculates the real time represented by the sum of the elapsed time between said first point and second point in time and the real time value in the electrically alterable read only memory; and (d) updates the real time value in the electrically alterable read only memory to approximate the correct real time value.

4. In the electric watt-hour meter according to claim 1, wherein said timing means includes: a voltage bus, a system common conductor, a series connected charging resistor and a timing capacitor connected across said bus and common conductor, a shunt resistor connected across said capacitor, a comparator having one input connected to the junction between said resistor and capacitor and having its output connected to an input of the microprocessor, and a voltage divider connected between said bus and said common conductor with the output of said divider being connected to the other input of said comparator.

5. In the electric watt-hour meter according to claim 4, further including: a first diode connected between said voltage bus and said voltage divider; and a second diode connected between said voltage bus and said series connected charging resistor and timing capacitor.

6. In the electric watt-hour meter according to claim 1, wherein said timing means includes:

a comparator having first and second inputs and an output which is coupled to an input of the microprocessor, a first voltage bus supplied from the microprocessor, said microprocessor having an internal switch for controlling the energization of said first voltage bus dependent upon the output state of said comparator, a first capacitor circuit comprising a diode and a first timing capacitor connected between said first voltage bus and a system common, a shunt resistor connected across said first timing capacitor, the junction between said diode and first timing capacitor being coupled to said first comparator input, a second voltage bus, a second capacitor circuit comprising a series connected charging resistor and second timing capacitor connected between said second voltage bus and said system common, the junction between said charging resistor and said second timing capacitor being connected to said second comparator input, and a shorting transistor circuit connected across said second timing capacitor and controlled by the voltage on said second voltage bus, said shorting transistor being turned off when there is voltage on said second voltage bus and being turned on when there is a loss of volage to short the second timing capacitor to prepare some for charging when voltage is restored, the charging of said second timing capacitor being compared with the decayed voltage level on said first timing capacitor such that the time period between the time of voltage restoration and the time when the voltage on said second timing capacitor equals the voltage on said first timing capacitor is indicative of the time period of the loss of voltage.

7. In the electric watt-hour meter according to claim 1, wherein said timing means includes:

a voltage bus and a system common, a comparator having first and second inputs and an output coupled to the microprocessor, a voltage divider including first and second series connected resistors connected between said voltage bus and system common, the junction between said resistors being connected to said first comparator input, a first transmission gate connected to said voltage bus and being controlled by a pulsed control line from the microprocessor, a second transmission gate connected to said system common and being controlled by a pulsed control line from the microprocessor, a conductor bus connected between said first and second gates and supplied with the potential (+V) on said voltage bus through said first gate or with the potential (oV) on said system common through said second gate, a capacitor circuit including a series connected charging resistor and a timing capacitor connected between said conductor bus and said system common, and a shunt resistor connected across said timing capacitor, the junction between said charging resistor and said timing capacitor being coupled to said second comparator input, the microprocessor being programmed to maintain said comparator output essentially zero when power is supplied to said watt-hour meter and to count the number of pulses supplied to said first gate between the time when power has been restored after a loss of power to said voltage bus and the time when the voltage on said timing capacitor equals the voltage at said first comparator input, said count of pulses being indicative of the time period of the loss of voltage.

* * * * *